United States Patent [19]
Jarrett

[11] Patent Number: 4,849,712
[45] Date of Patent: Jul. 18, 1989

[54] AMPLIFIER GAIN CONTROL CIRCUIT ARRANGEMENTS

[75] Inventor: Adrian Jarrett, Surrey, England

[73] Assignee: Plessey Overseas Limited, Ilford, England

[21] Appl. No.: 61,238

[22] Filed: Jun. 11, 1987

[30] Foreign Application Priority Data

Jun. 19, 1986 [GB] United Kingdom ................ 8614920

[51] Int. Cl.$^4$ .............................................. H03F 3/00
[52] U.S. Cl. .................................... 330/283; 330/289; 330/290
[58] Field of Search ..................... 330/87, 95, 56, 283, 330/289, 290

[56] References Cited

PUBLICATIONS

Abdulleav et al., "A Pulse Amplifier with a Controllable Gain", *Instruments and Experimental Techniques,* vol. 18, No. 2, pt. 2, pp. 485–487, Mar.–Apr., 1975 (published Sep. 1975).

*Primary Examiner*—James B. Mullins
*Attorney, Agent, or Firm*—Fleit, Jacobson, Cohn & Price

[57] ABSTRACT

A gain control circuit arrangement comprises a transistor amplifier (A) for providing an output signal (OP) in response to a received input signal (IP). The gain of the transistor amplifier (A) is controlled by means of a field effect transistor (TF) connected in the emitter circuit of the amplifier and included in a feedback control loop to which a gain control signal (Ref A) is applied in operation of the gain control arrangement. A collector load of the amplifier comprises a potential divider (R1 and R2) one portion of which is shunted by a control loop which serves to maintain constant the collector current passing through the transistor amplifier.

2 Claims, 1 Drawing Sheet

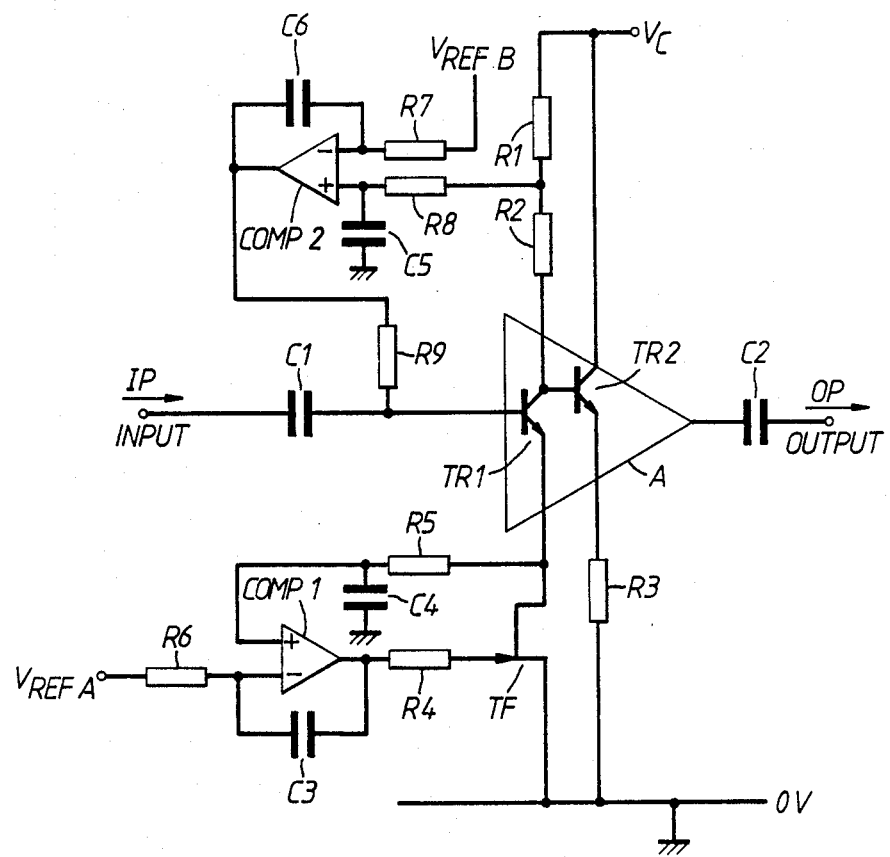

AMPLIFIER GAIN CONTROL CIRCUIT ARRANGEMENTS

This invention relates to amplifier gain control circuit arrangements and is directed to such arrangements having good stability and providing high gain-bandwidth characteristics.

According to the present invention there is provided a gain control circuit arrangement comprising a transistor amplifier for providing an output signal in response to a received input signal, in which the gain of the transistor amplifier is controlled by means of a field effect transistor connected in an emitter circuit of the transistor amplifier and included in a feedback control loop to which a gain control signal will be applied in operation of the gain control arrangement and in which a collector load of the transistor amplifier comprises a potential divider one portion of which is shunted by a control loop which serves to maintain constant the collector current passing through the transistor amplifier.

By way of example the present invention will now be described with reference to the accompanying single-FIGURE drawing which shows a gain control circuit for a transistor amplifier.

Referring to the drawing, a transistor amplifier A comprises a transistor TR1 having a potential divider defined by resistors R1 and R2 connected in its collector circuit which is connected to a voltage VC. A field effect transistor TF is connected to the emitter circuit of the transistor TR1 which is connected to ground.

The amplifier A also includes a further transistor TR2 the base of which is directly connected to the collector of the transistor TR1. The emitter of the further transistor TR2 is connected to ground through a resistor R3 and a collector is directly connected to the voltage source VC.

An AC input signal IP applied to the base of the transistor TR1 through a coupling capacitor C1 will cause an amplifier output signal OP to be obtained from the emitter of the transistor TR2 through a further coupling capacitor C2.

The gain of a transistor amplifier is given by:

$$\frac{Rc}{Re} \text{ if } Re \frac{1}{gm} \text{ or}$$

$$\frac{Rc}{Re + \frac{1}{gm}} \text{ if } Re \text{ is of the same order as } \frac{1}{gm}$$

where
Rc = collector load resistance
Re = emitter load resistance and
gm = mutual conductance of the amplifier As will be appreciated from a consideration of the drawing, the gain of the transistor amplifier A will be $$\frac{R1 + R2}{R3/RFET}$$

where RFET is the effective resistance of the field effect transistor TF.

It can readily be seen therefore that if the resistance of the transistor TR is varied the gain of the transistor amplifier will also be varied.

For the purpose of varying the resistance of the field effect transistor TF a control loop circuit is provided in association with the transistor TF and comprises resistors R4, R5 and R6, capacitors C3 and C4 and a comparator COMP 1. A gain control voltage VREF A is applied to the control loop circuit and this voltage controls the effective resistance of the field effect transistor TF. However, in order to linearise the operation of the transistor amplifier with changes in temperature which can cause changes to occur in the collector and emitter current a further control loop feedback arrangement is provided comprising resistors R7, R8 and R9, capacitors C5 and C6 and a comparator COMP 2 by which the voltage at the junction of the resistors R1 and R2 in the collector circuit of the transistor TR1 is effectively compared with a control voltage VREF B and a resultant voltage is applied to the base of transistor TR1 to maintain the collector current constant. Since IC (collector current) = IE (emitter current) the emitter current and thus the voltage drop across the field effect transistor TR is also maintained constant.

If the resistance RFET (1/gm) the temperature-dependent variations in gain will have negligent effect on the circuit arrangement.

The gain control circuit arrangement of the present invention has good stability and provides a high gain-bandwidth amplifier which is eminently suitable for use in IF systems and pulse amplifiers, as used in radar signal processing systems.

I claim:
1. A gain control circuit arrangement comprising:
   a. a transistor amplifier including a first transistor having a collector, base and emitter;
   b. a second transistor constituted by a field effect transistor connected to the emitter of the first transistor;
   c. a feedback control loop circuit connected across the field effect transistor and including a first comparator;
   d. means for applying a predetermined gain control signal to the first comparator to control the effective resistance of the field effect transistor to provide the requisite transistor amplifier gain;
   e. potential divider means connected to the collector of the first transistor;
   f. a linearising control loop circuit including a second comparator and connected to the base of the first transistor and shunting a portion of the potential divider means; and,
   g. means for applying a control voltage to the second comparator to maintain the collector current in the first transistor constant in spite of ambient temperature changes.

2. A gain control circuit arrangement as claimed in claim 1, in which the transistor amplifier includes a third transistor having a base connected to the collector of the first transistor with the output from the transistor amplifier being derived from the emitter of the third transistor.

* * * * *